United States Patent [19]

Cresswell

[11] 4,086,127
[45] Apr. 25, 1978

[54] METHOD OF FABRICATING APERTURED DEPOSITION MASKS USED FOR FABRICATING THIN FILM TRANSISTORS

[75] Inventor: Michael W. Cresswell, Plum Borough, Pa.

[73] Assignee: Westinghouse Electric Corporation, Pittsburgh, Pa.

[21] Appl. No.: 812,086

[22] Filed: Jul. 1, 1977

[51] Int. Cl.² ............................................. C23F 1/02
[52] U.S. Cl. .................................. 156/643; 156/644; 156/656; 156/659; 428/137
[58] Field of Search ............... 156/643, 644, 645, 656, 156/659, 664; 219/121 EB, 121 EM, 121 L, 121 LM; 428/137; 96/36.4

[56] References Cited

U.S. PATENT DOCUMENTS

| 3,574,012 | 4/1971 | Penberg | 156/644 X |
| 3,668,028 | 6/1972 | Short | 156/644 X |
| 3,958,255 | 5/1976 | Chiou et al. | 156/644 X |
| 4,013,502 | 3/1977 | Staples | 156/661 X |
| 4,021,276 | 5/1977 | Cho et al. | 156/661 X |

*Primary Examiner*—William A. Powell
*Attorney, Agent, or Firm*—W. G. Sutcliff

[57] ABSTRACT

An improved method of fabricating apertured deposition masks is disclosed, with the masks being used in the fabrication of thin film deposited electronic components such as transistors. The masks comprise a core portion with a metal layer provided on a relief side of the core and a metal layer provided on the defining side of the core. The relief side metal layer and the core of the mask are further resist delineated, selectively plated and etched differentially providing a mask preform in which the defining side metal layer is left intact. A narrow width radiation beam is then directed upon closely spaced portions of the defining side metal layer to selectively cut through the defining side metal layer providing the desired space apertures separated by a narrow bridge portion of the defining side metal layer.

4 Claims, 9 Drawing Figures

SEQUENCE OF PRESENT INVENTION

SEQUENCE OF PRIOR ART

SEQUENCE OF PRESENT INVENTION

METHOD OF FABRICATING APERTURED DEPOSITION MASKS USED FOR FABRICATING THIN FILM TRANSISTORS

BACKGROUND OF THE INVENTION

The present invention relates to a method of fabricating production aperture masks used in making thin film circuit components. More particularly, the present invention relates to making apertured deposition masks which are typically used in producing thin film field effect transistors which have very closely spaced source and drain contacts disposed upon a semiconductive channel. The gain of such thin film field effect transistors can be significantly improved when the semiconductive channel is very narrow between the source and drain contacts. It is also known to use interdigitated source and drain finger contacts upon a semiconductive pad to produce an array of electrically parallel thin film field effect transistors.

The conventional fabrication method of making such masks for thin film circuit fabrication consists of a sequence of photoresist delineation, etching, and plating steps. The masks comprise a beryllium-copper core material which is typically about 0.003 to 0.005 inches thick with a strengthening nickel plated layer on either side of the core. The nickel plated layer is typically about 0.0005 inches thick. One side of the mask is termed the relief side of the mask, which is the side closest to the material source during the deposition step. The other side of the mask is termed the defining side of the mask, and the aperture area on the defining side of the mask is typically smaller in area than the aperture opening on the relief side of the mask, and the defining aperture area corresponds to the deposition area on the substrate.

In the conventional fabrication technique the nickel layers are plated over the selectively photoresist coated core portion with a resultant nickel overhang being provided over the photoresist. The nickel layer on the defining side of the mask which remains after the closely spaced apertures are formed is termed a bridge and acts to provide the separation of source-drain transistor contacts during thin film transistor fabrication. The minimum nickel layer bridge which has been found to be achievable repeatably using the conventional fabrication technique provides a nickel bridge that is about 0.0012 inch wide between a source and drain aperture. This fabrication technique thus limits the minimum semiconductor channel width between the deposited source and drain contacts to about the nickel bridge width and limits the gain of the resultant thin film field effect transistor devices.

SUMMARY OF THE INVENTION

A method of fabricating apertured deposition masks is disclosed in which reduced bridging areas can be defined between spaced apertures. Such apertured deposition masks can be used in the fabrication of thin film deposited electronic components including high gain thin film field effect transistors which have very closely spaced source and drain contacts. The apertured deposition mask has a plurality of closely spaced apertures extending through the mask with solid mask bridge portions between the spaced apertures. The apertured deposition mask comprises a core portion with a metal layer provided on a relief side of the core, and a metal layer provided on a defining side of the core. The method comprises selectively photoresist delineating and plating portions of the relief side metal layer and etching portions of the mask core while leaving the defining side metal layer intact. A narrow width radiation beam is then directed upon closely spaced portions of the defining side metal layer which portions are aligned over the etched portions of the core and relief side metal layer. The radiation beam selectively cuts through the defining side metal layer to provide the desired spaced apertures separated by the requisite bridge portion of defining side metal layer. The improved apertured deposition masks permit fabrication of high gain thin film field effect transistors.

DESCRIPTION OF THE PREFERRED EMBODIMENTS

Figure 1A:
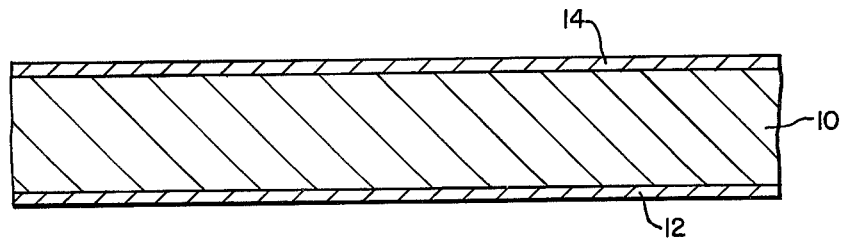
FIGS. 1A-1D describe in a schematic fashion the prior art conventional aperture deposition mask fabrication technique.
Figure 1B:
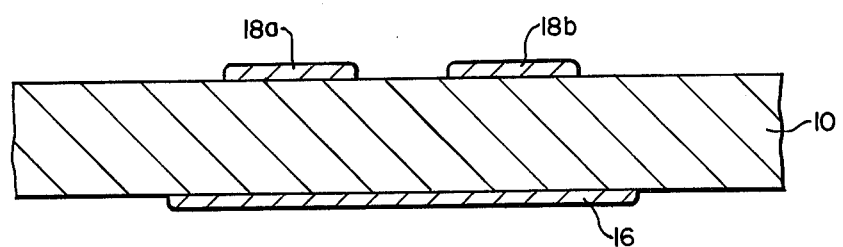
Figure 1C:
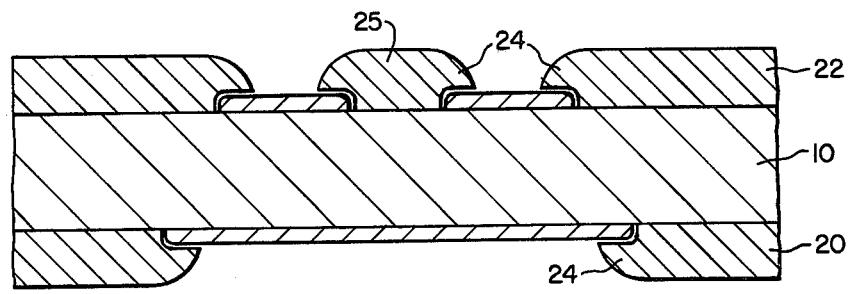
Figure 1D:
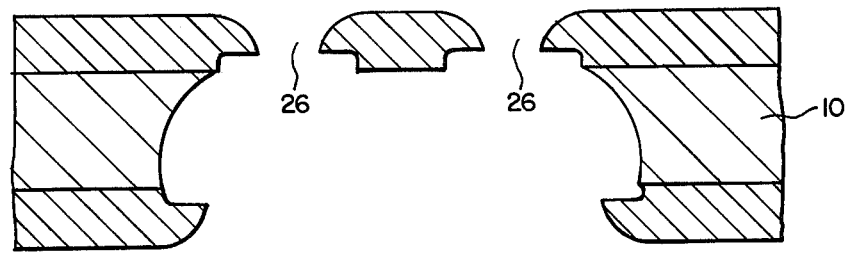

The invention can be best understood by reference to the conventional prior art processing technique for providing two closely spaced apertures on the defining side of a mask as seen in FIGS. 1A-1D. In FIG. 1A the mask core 10 is a 0.03 to 0.005 thick beryllium copper material with a relief side photoresist layer 12 provided on one side of the core 10 and a defining side photoresist layer 14 provided on the other side. The relief side of a photomask is provided with a larger aperture area than the defining side apertures which will correspond to the desired deposit. The relief side aperture is larger to insure that there is a minimizing of shadowing effect during the line of sight deposition process. The photoresist layers on both the relief side and the defining side are then exposed to photo-radiation and hardened photoresist exposure areas 16 on the relief side of the core and smaller photo hardened photoresist areas 18a and 18b on the defining side of the core are seen in FIG. 1B. The remainder of the photoresist layers 12 and 14 which were unexposed are removed by a conventional washing technique. A nickel layer 20 and 22 is respectively plated upon the relief side and the defining side of the core. The nickel layer is typically about 0.0005 inch thick. The nickel layer overlaps or overhangs the photoresist edge areas as illustrated in FIG. 1C by the overhang areas 24 of the nickel layers. This nickel layer overhang over the photoresist limits the minimum size of source-drain "bridge" 25 which can be produced on the defining side of the mask. It is the defining side apertures which control the area of the deposited contacts. The hardened photoresist areas 16 and 18 are thereafter chemically developed and removed from the core and the nickel layered core is then selectively etched to provide apertures 26 which extend through the mask as seen in FIG. 1D.

Figure 2A:
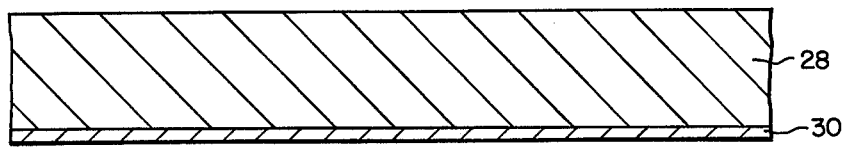
FIGS. 2A-2E describe in a sequential schematic fashion the improved fabrication technique of the present invention.
Figure 2B:
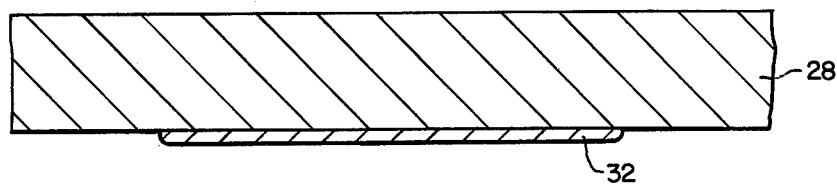
Figure 2C:
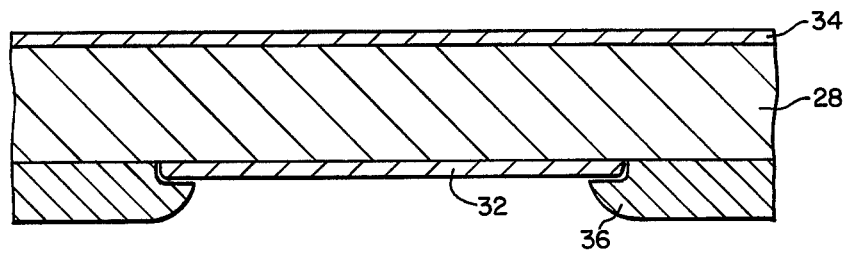

The apertured deposition mask fabrication technique of the present invention is illustrated in FIGS. 2A-2D. In FIG. 2A the mask core 28 again is a beryllium copper core. A photoresist area layer 30 is provided only on the relief side of the core. The photoresist layer 30 on the relief side is photoexposed selectively, and hardened area 32 remains as seen in FIG. 2B after removal of the unexposed photoresist. As seen in FIG. 2C, a nickel layer 34 is then plated upon the defining side of the core, with this nickel layer 34 being a continuous layer. A nickel layer 36 is provided on the relief side of the core upon which the hardened photoresist areas are provided, again with the nickel overhanging or overlapping the photoresist edge areas. The photoresist is then developed and removed from the relief side of the core and the core portion underlying the area from which the hardened photoresist has been removed is then etched to provide a partially completed etched mask in which the defining side nickel layer remains intact while the aperture is provided through the relief side nickel layer and the core, aligned with the relief side nickel layer apertures.

Figure 2D:
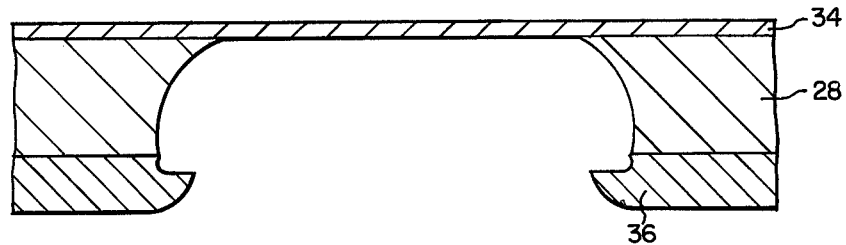
Figure 2E:
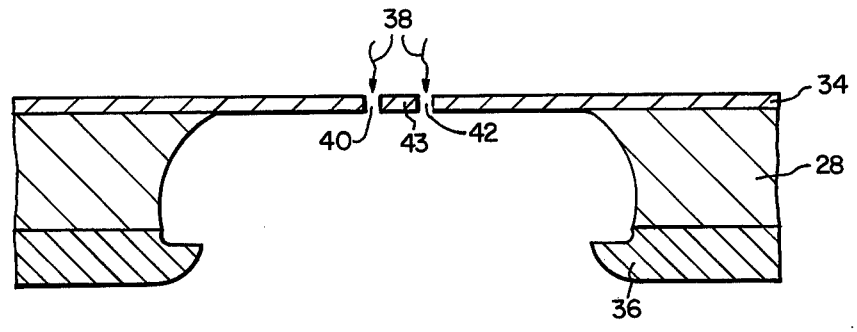

As seen in FIG. 2D, a narrow width radiation beam 38 is then directed upon the defining side nickel layer to selectively cut through the defining side nickel layer 34 providing the desired closely spaced apertures 40 and 42, which are preferably elongated aperture areas, with the aperture width being about 5 microns or more, and the remaining nickel bridge portion 43 between the elongated apertures 40 and 42 is also about 5 microns in width as compared to a 25 micron or more bridge width achieved by prior art techniques.

The narrow width radiation beam can be provided by a highly focused electron beam of sufficient power density to cut through the thin nickel layer, or by a well focused laser beam with the requisite beam characteristics and power density for penetrating the thin nickel layer. A general description of such lasers which have been used for scribing and drilling through ceramic and metal substrates is provided in "Lasers in Industry", edited by S. S. Charschan, published by Van Nostrand Reinhold Company, 1972. The recently developed continuous power carbon dioxide gas laser system is readily usable for such cutting or drilling of holes in metal substrates because of the uniform output beam profile. To cut or scribe an elongated aperture area as desired in the present application a programmable laser scribing machine can be used in which the radiation beam is moved in a predetermined pattern on the nickel layer.

Figure 3:
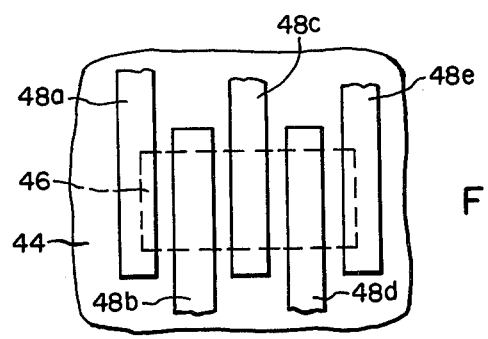
FIG. 3 is a plan view of a partially fabricated thin film transistor array demonstrating a closely spaced interdigitated source-drain finger arrangement upon a semiconductive channel, as can be produced utilizing the present invention.

The resultant apertured deposition mask seen in FIG. 2D, can then be used in the fabrication of thin film field effect transistor devices which have a very closely spaced source and drain contacts. A particularly advantageous partially fabricated thin film device is illustrated schematically in FIG. 3. The device is provided upon an insulating substrate 44 with a thin film semiconductive pad 46 deposited thereon and wherein interdigitated source and drain finger contacts 48a, 48b, 48c, 48d, 48e are spaced on the semiconductive pad 42. An insulator layer would be provided over the interdigitated source drain contacts and a gate deposited for effecting control of the transistor array which consists of a plurality of electrically parallel thin film field effect transistors. The interdigitated contacts 48a, 48b, 48c, 48d, 48e are spaced on about 15 micron centers and the resultant parallel devices exhibit a high gain characteristic.

I claim:

1. A method of fabricating apertured deposition masks which are used in the fabrication of thin film deposited electronic components, wherein the apertured deposition mask has a plurality of closely spaced apertures therethrough with solid mask bridge portions between the spaced apertures, which bridge portion is of a predetermined dimension and wherein the apertured deposition mask comprises a core portion with a first metal layer provided on a relief side of the core, and a second metal layer provided on a defining side of the core which method comprises:
    (a) selective photoresist delineation and etching of portions of the relief side metal layer and the core while leaving the defining side metal layer intact;
    (b) directing a narrow width radiation beam upon closely spaced portions of the defining side metal layer, which portions are aligned over the etched portions of the core and the relief side metal layer, to selectively cut through the defining side metal layer providing the desired spaced apertures separated by the requisite bridge portion of defining side metal layer.

2. The method set forth in claim 1, wherein the deposition mask is for closely spaced source and drain contacts of a thin film field effect transistor, and wherein the bridge portion between source and drain apertures in the mask is less than about 5 microns.

3. The method set forth in claim 2, wherein the source and drain contact apertures are interdigitated patterns which are spaced apart by about 5 microns or less.

4. The method set forth in claim 1, wherein the relief side metal layer and core etched aperture area exceeds the desired defining side metal layer aperture area by a factor sufficient to permit plural defining side metal layer apertures to be provided within a single relief side metal layer and core etched aperture area.

* * * * *